(12) United States Patent
Yin et al.

(10) Patent No.: US 8,524,565 B2
(45) Date of Patent: Sep. 3, 2013

(54) SEMICONDUCTOR DEVICE AND METHOD FOR FORMING THE SAME

(75) Inventors: Haizhou Yin, Poughkeepsie, NY (US); Zhijiong Luo, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/063,882

(22) PCT Filed: Feb. 16, 2011

(86) PCT No.: PCT/CN2011/071020
§ 371 (c)(1),
(2), (4) Date: Mar. 14, 2011

(87) PCT Pub. No.: WO2011/160456
PCT Pub. Date: Dec. 29, 2011

(65) Prior Publication Data
US 2013/0115743 A1    May 9, 2013

(30) Foreign Application Priority Data

Jun. 22, 2010  (CN) .......................... 2010 1 0215125

(51) Int. Cl.
*H01L 21/336*  (2006.01)
(52) U.S. Cl.
USPC .................... 438/300; 438/589; 257/E21.431

(58) Field of Classification Search
USPC ........... 257/E21.37, E21.385, E21.4, E21.42, 257/E21.483
See application file for complete search history.

(56) References Cited

U.S. PATENT DOCUMENTS

| 2008/0132011 A1* | 6/2008 | Lee et al. ...................... 438/191 |
| 2008/0157200 A1* | 7/2008 | Kim et al. ...................... 257/347 |

FOREIGN PATENT DOCUMENTS

| CN | 1738059 | 2/2006 |
| CN | 101369598 | 2/2009 |
| CN | 101540315 | 9/2009 |

OTHER PUBLICATIONS

PCT/CN2011/071020 International Search Report and Written Opinion.

* cited by examiner

*Primary Examiner* — Cheung Lee
(74) *Attorney, Agent, or Firm* — Troutman Sanders LLP

(57) ABSTRACT

A method for forming a semiconductor device is provided, wherein a step of forming an S/D region comprises: determining an interface region comprising an active region of a partial width abutting an isolation region, and forming an auxiliary layer covering the interface region; removing a semiconductor substrate of a partial thickness in the active region using the auxiliary layer, a gate stack structure and the isolation region as a mask, so as to form a groove; and growing a semiconductor material in the groove for filling into the groove. A semiconductor device having a material of the semiconductor substrate sandwiched between an S/D region and an isolation region is further provided. The present invention is beneficial to reduce current leakage.

5 Claims, 7 Drawing Sheets

SEMICONDUCTOR DEVICE AND METHOD FOR FORMING THE SAME

BENEFIT CLAIMS

This application is a US National Stage of International Application No. PCT/CN2011/071020, filed Feb. 16, 2011, which claims the benefit of CN 201010215125.8, filed Jun. 22, 2010.

FIELD OF THE INVENTION

The present invention relates to a technical field of semiconductors, and particularly, to a semiconductor device and a method for forming the same.

BACKGROUND OF THE INVENTION

Currently, a method for forming a semiconductor device comprises the following steps. Firstly, as illustrated in FIGS. 1 and 2, an active region 20 and an isolation region 12 surrounding the active region 20 are formed on a semiconductor substrate 10. Next, as illustrated in FIGS. 3 and 4, a gate stack structure is formed on the active region 20 and extends onto the isolation region 12 (The gate stack structure comprises a gate dielectric layer 22, a gate 24 formed on the gate dielectric layer 22, and a sidewall spacers 26 surrounding the gate dielectric layer 22 and the gate 24. In practice, a cap layer is further formed on the gate for preventing the gate from being damaged during the operation. The cap layer is usually made of silicon nitride. The cap layer is not indicated in the description and drawings of this specification for the convenience of explanation). Next, as illustrated in FIGS. 5 and 6, using the gate stack structure and the isolation region 12 as a mask, the semiconductor substrate 10 of a partial thickness in the active region 20 is removed so as to form a groove 30. Finally, a semiconductor material is grown in the groove 30 for filling into the groove 30, so as to form a source/drain (S/D) region.

However, as illustrated in FIGS. 7 to 9, it is found in practice that a gap 34 is formed at the interface of the S/D region 32 and the isolation region 12; and consequently, as illustrated in FIGS. 10 to 12, when a contact region 36 (e.g., metal silicide layer) is formed subsequently on the S/D region 32, the contact region 36 may easily extend onto the junction region via the gap 34, thereby causing an current leakage.

SUMMARY OF THE INVENTION

In order to solve the above problem, the present invention provides a semiconductor device which is beneficial to reduce the current leakage and a method for forming the same.

The present invention provides a method for forming a semiconductor device, comprising: forming an active region and an isolation region surrounding the active region on a semiconductor substrate; forming a gate stack structure, wherein the gate stack structure is formed on the active region and extends onto the isolation region; and forming an S/D region, wherein the S/D region is embedded into the semiconductor substrate in the active region and located at both sides of the gate stack structure; wherein the step of forming the S/D region comprises: determining an interface region comprising the active region of a partial width abutting the isolation region, and forming an auxiliary layer covering the interface region; removing the semiconductor substrate of a partial thickness in the active region using the auxiliary layer, the gate stack structure and the isolation region as a mask so as to form a groove; and growing a semiconductor material in the groove for filling into the groove.

Optionally, the material of the auxiliary layer is made of one of silicon oxide and silicon nitride, or a combination thereof.

Optionally, the partial width is far less than the width of the active region in a direction parallel to the source to drain direction.

Optionally, the partial width is the minimum dimension allowed by a photolithographic process.

Optionally, for a PMOS device, the semiconductor material is $Si_{1-x}Ge_x$, and for an NMOS device, the semiconductor material is Si:C.

The present invention provides a semiconductor device formed on an active region, the active region is formed on a semiconductor substrate and surrounded by an isolation region, and the semiconductor device comprises: a gate stack structure formed on the active region and extends onto the isolation region; an S/D region which is embedded into the semiconductor substrate in the active region and located at both sides of the gate stack structure, wherein an interface region of the S/D region and the isolation region is formed of a semiconductor substrate material.

Optionally, the width of the semiconductor substrate material formed in the interface region of the S/D region and the isolation region is far less than the width of the active region in a direction parallel to the source to drain direction.

Optionally, the partial width is the minimum dimension allowed by a photolithographic process.

Optionally, in case the semiconductor substrate material is Si, for a PMOS device, the semiconductor material is $Si_{1-x}Ge_x$, and for an NMOS device, the semiconductor material is Si:C.

As compared with the prior art, the technical solution of the present invention has the following advantages:

After the interface region (including the active region of a partial width abutting the isolation region) is determined, the auxiliary layer is formed to cover the interface region so that the semiconductor substrate material is residual between the groove and the isolation region when the groove is formed, i.e., the walls of the groove are all made of the semiconductor substrate material. Then the semiconductor substrate material is used as seed crystal. This is beneficial for the semiconductor material to grow uniformly along respective directions in the groove, and hence beneficial to reduce the possibility of defining a gap at the interface of the formed S/D region and the isolation region.

The auxiliary layer is added as a mask during the formation of the residual material of the semiconductor substrate between the groove and the isolation region, and the auxiliary layer may be removed after the residual material of the semiconductor substrate is formed. This is beneficial for the compatibility of the technical solution of the present invention with the conventional process.

When $Si_{1-x}Ge_x$ is taken as the semiconductor material in the PMOS device, and Si:C is taken as the semiconductor material in the NMOS device, it is beneficial to adjust the mobility of carriers in the channel region of the semiconductor device by using the stress provided by each semiconductor material. The walls of the groove are all made of the semiconductor substrate material, so that the possibility of defining a gap in the interface region is reduced when the semiconductor materials are produced in the groove to form the S/D region, which is beneficial to reduce the stress loss of each of the semiconductor materials and improve the mobility of carriers in the channel region.

BRIEF DESCRIPTION OF THE DRAWINGS

The following sectional views are obtained by sectioning the formed structures along the section lines (AA' and BB') given in corresponding top views.

DETAILED DESCRIPTION OF THE EMBODIMENTS

The following text provides many different embodiments or examples to implement the technical solution of the present invention. Although descriptions of the components and arrangements of specific examples are given as follows, they are just exemplary, and do not intend to limit the present invention.

In addition, reference numbers and/or letters may be repeated in different embodiments of the present invention for the purposes of simplification and clarity, without indicating the relationships between the discussed embodiments and/or arrangements.

The present invention provides examples of various specific processes and/or materials. However, it is apparent that substitutive applications of other processes and/or materials conceivable by a person skilled in the art do not depart from the scope of the present invention. To be emphasized, the interfaces of various regions described in this specification include necessary extensions made according to the requirements of the processes or procedures.

The present invention provides a method for forming a semiconductor device, and the method comprises the following steps.

Figure 1:
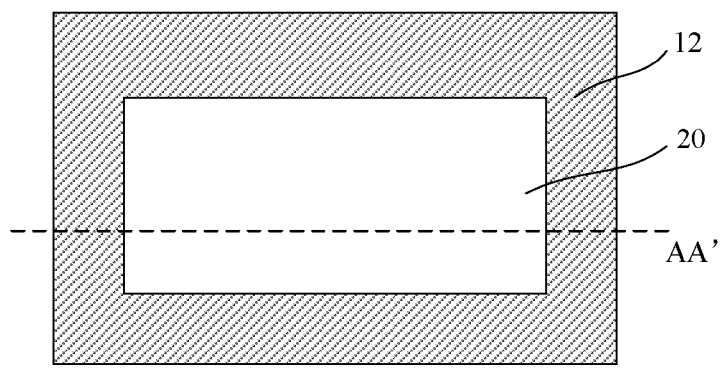
FIGS. 1-2 illustrate structural diagrams after an active region is formed according to the prior art.
Figure 2:
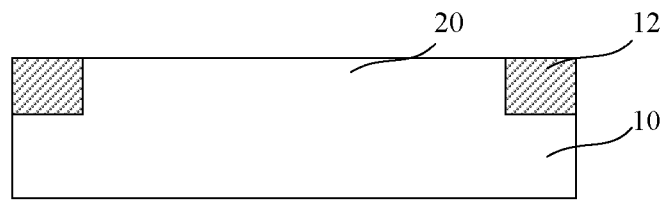
Figure 3:
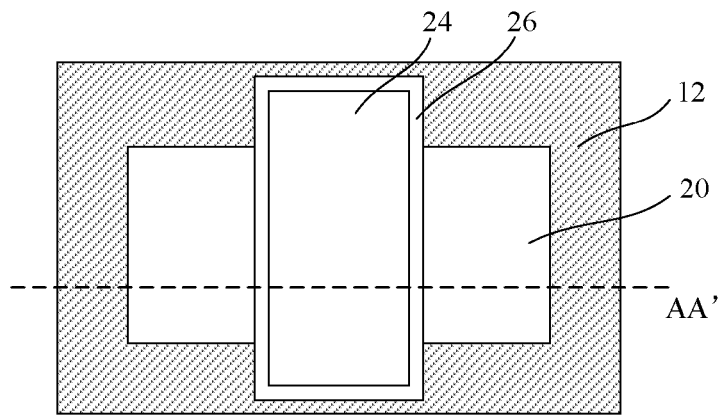
FIGS. 3-4 illustrate structural diagrams after a gate stack structure is formed according to the prior art.
Figure 4:
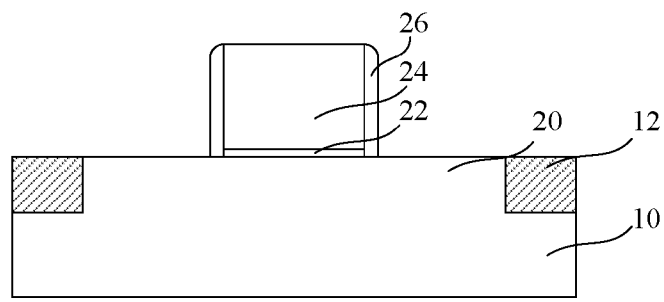
Figure 5:
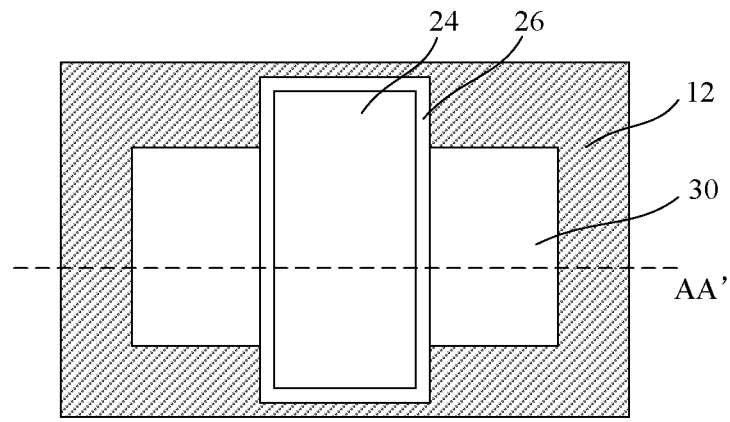
FIGS. 5-6 illustrate structural diagrams after a groove is formed according to the prior art.
Figure 6:
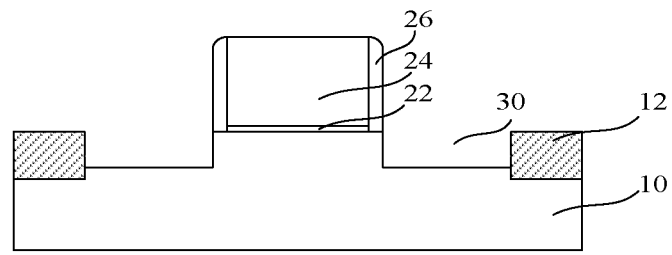
Figure 7:
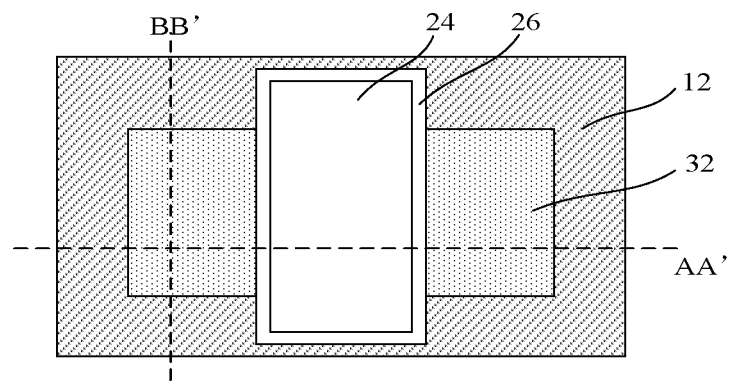
FIGS. 7-9 illustrate structural diagrams after an S/D region is formed according to the prior art.
Figure 8:
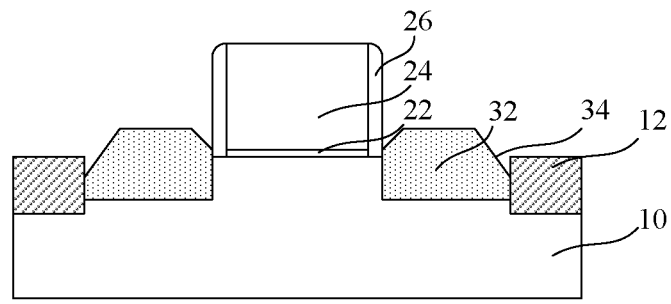
Figure 9:
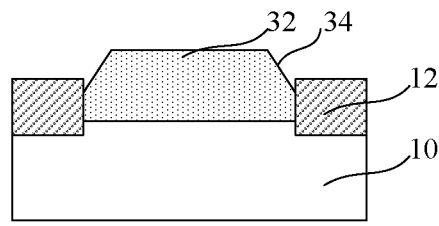
Figure 10:
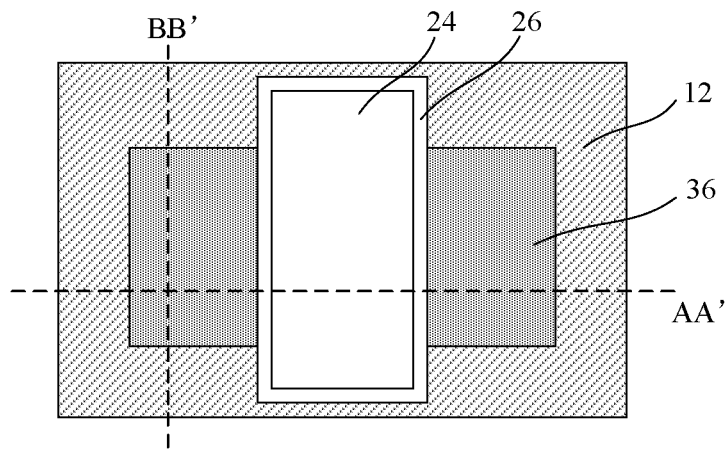
FIGS. 10-12 illustrate structural diagrams after a contact region is formed according to the prior art.
Figure 11:
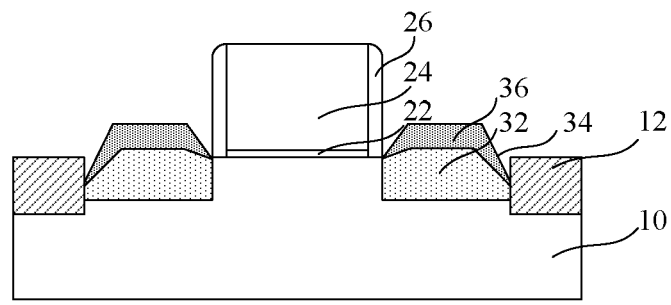
Figure 12:
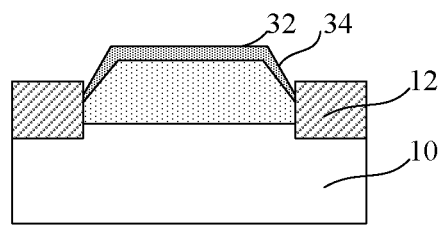
Figure 13:
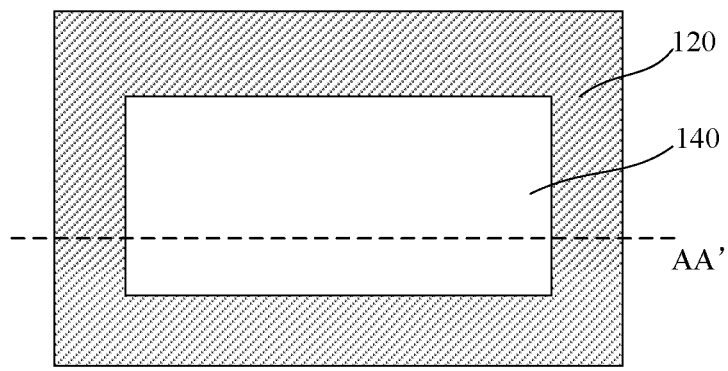
FIGS. 13-14 illustrate structural diagrams after an active region is formed in a method for forming a semiconductor device according to an embodiment of the present invention.
Figure 14:
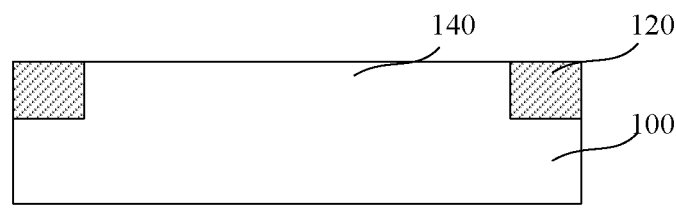

Firstly, as illustrated in FIGS. 13 and 14, an active region 140 and an isolation region 120 surrounding the active region 140 are formed on a semiconductor substrate 100.

Specifically, the semiconductor substrate 100 herein has undergone processing operations comprising pre-cleaning and well region formation. In the present embodiment, the semiconductor substrate 100 is a silicon substrate, and in other embodiments, the semiconductor substrate 100 may also include other compound semiconductor, such as silicon carbide (SiC), gallium arsenide (GaAs), indium arsenide (InAs) or indium phosphide (InP). In addition, the semiconductor substrate 100 preferably comprises an epitaxial layer. The semiconductor substrate 100 may also include a silicon on insulator (SOI) structure.

The semiconductor devices are formed on the active region 140 and spaced apart from each other by the isolation region 120.

Figure 15:
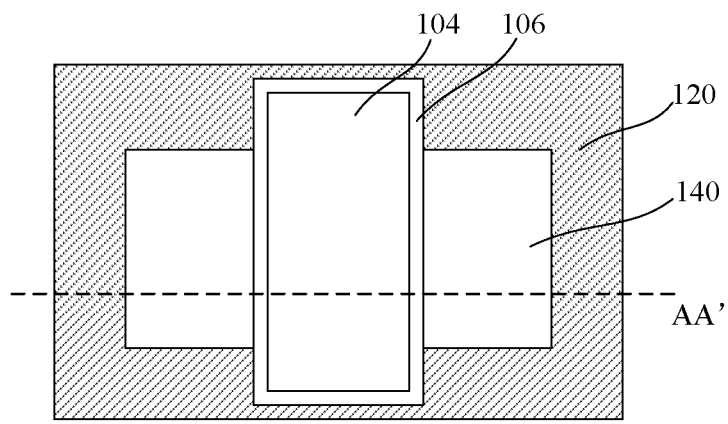
FIGS. 15-16 illustrate structural diagrams after a gate stack structure is formed in the method for forming the semiconductor device according to the embodiment of the present invention.
Figure 16:
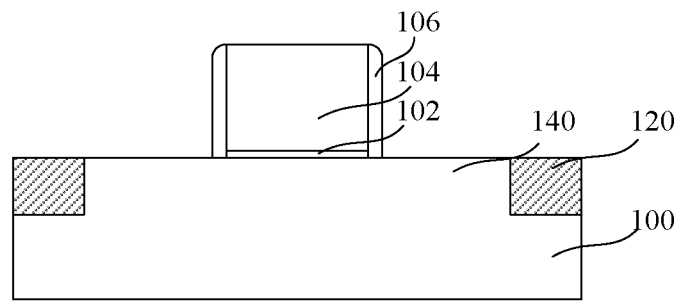

Next, as illustrated in FIGS. 15 and 16, a gate stack structure is formed on the active region 140 and extends onto the isolation region 120.

The gate stack structure comprises a gate dielectric layer 102 formed on the active region 140, a gate 104 formed on the gate dielectric layer 102, and sidewall spacers 106 surrounding the gate dielectric layer 102 and the gate 104. The gate 104 may be formed using a gate first or gate last process. When the gate 104 is formed using the gate first process, the gate 104 may be a stacked metal gate; and when the gate 104 is formed using the gate last process, the gate 104 may be a replacement gate (the replacement gate is removed to form a metal gate after the S/D region and an interlayer dielectric layer are formed subsequently). The gate dielectric layer 102 may be made of hafnium-based materials, such as one of $HfO_2$, HfSiO, HfSiON, HfTaO, HfTiO and HfZrO, or any combination thereof. The materials for the sidewall spacers 106 may comprise one of SiN, SiO, SiON and SiC, or any combination thereof. The sidewall spacers 106 may have a multi-layer structure. The gate 104, the gate dielectric layer 102, the sidewall spacers 106 and the above processing operations may be formed or implemented by conventional processes. The gate stack structure may be connected to the outside via a portion extending to the isolation region 120.

Figure 17:
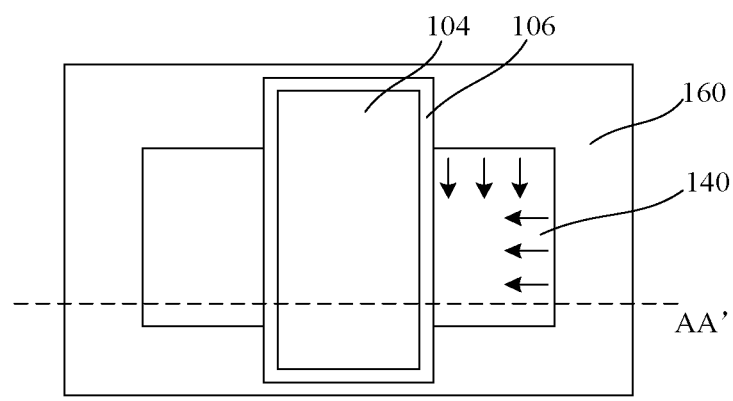
FIGS. 17-18 illustrate structural diagrams after an auxiliary layer is formed in the method for forming the semiconductor device according to the embodiment of the present invention.
Figure 18:
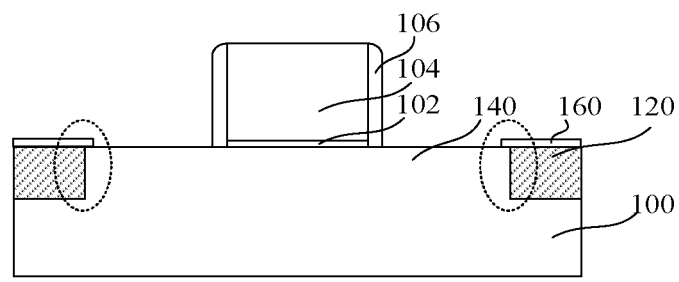

Next, as illustrated in FIGS. 17 and 18, an interface region comprising the active region 140 of a partial width abutting the isolation region 120 is determined, and an auxiliary layer 160 covering the interface region (indicated by the block of the dashed line in the drawings) is formed.

The material of the auxiliary layer 160 is one of silicon oxide and silicon nitride, or a combination thereof. Specifically, the silicon oxide comprises doped or un-doped silicon oxide glass, such as fluorinated-silicate glass (FSG), borosilicate glass (BSG), phosphosilicate glass (PSG), boro-phospho-silicate glass (BPSG), silicon oxycarbide or silicon oxycarbonitride. The silicon nitride may also be silicon carbonitride. The auxiliary layer 160 may be formed by the conventional process (e.g., a combination of the depositing and etching processes). Herein, when the residual semiconductor substrate material is formed on the sidewalls of the isolation region 120 close to the S/D region, the auxiliary layer 160 is used as a mask.

In the prior art, the reason for the formation of the gap between the S/D region and the isolation region 120 is as follows. The S/D region is made of the semiconductor material filled into the groove, and the semiconductor material is grown by an epitaxial process. The gate stack structure and the isolation region 120 are used as the mask when the groove is formed. That is, the sidewalls of the isolation region 120 will be exposed after the groove is formed. In other words, the walls of the groove comprise both the semiconductor substrate material and the sidewalls of the isolation region 120. When the semiconductor material is grown through the epitaxial process, the semiconductor substrate material is used as the seed crystal, i.e., the sidewalls of the isolation region 120 used as the walls of the groove may not provide the seed crystal. In addition, it is found that the semiconductor material has different growth rates along different crystal orientations. Specifically, as compared with orientations (100) and (110), the semiconductor material has a slower growth rate along the orientation (111). In practice, an orientation perpendicular to the semiconductor substrate 100 is generally the orientation (100), and an orientation parallel to the semiconductor substrate 100 is the orientation (110). Then, the orientation (111) obliquely crosses the orientations (100) and (110). That is, because the semiconductor material has a slower growth rate along the orientation (111), the semiconductor material will form an oblique side surface (along the orientation (111)), and a gap will be formed between the oblique side surface and the sidewalls of the isolation region 120.

It is considered that it is beneficial to reduce or even eliminate the gap between the S/D region and the isolation region 120 so as to reduce the current leakage when the semiconductor substrate material is retained or formed on the sidewalls of the isolation region 120, in other words, the proportion of the semiconductor substrate material in the walls of the groove is increased. That is, by supplementing the semiconductor substrate material having different crystal orientations as the seed crystal, the above gap is filled by the semiconductor material formed by epitaxial growth of the supplemented seed crystal.

In the present embodiment, the auxiliary layer 160 is introduced to shield the active region 140 of a partial width abutting the isolation region 120, so that the active region 140 of the partial width will not be removed during the formation of the groove, i.e., the active region 140 of the partial width may be used as the supplemented seed crystal when the groove is filled.

In this specification, the width refers to a linear space occupied by any region in a determined direction.

In a direction (as indicated by the arrow in the drawing) parallel to the semiconductor substrate 100 and perpendicular to the isolation region 120, the partial width is far less than the width of the active region 140. For example, the partial width may be less than or equal to 5% of the width of the active region 140. Specifically, when the width of the active region 140 is 2000 Å, the partial width may be 100 Å. In practice, the partial width may be the minimum dimension allowed by a photolithographic process, for the purpose of making the supplemented seed crystal as thin as possible, so that the technical solution of the present invention is more compatible with the conventional process.

After the interface region (including the active region of a partial width abutting the isolation region) is determined, the auxiliary layer 160 is formed to cover the interface region, so that the semiconductor substrate material is residual between the groove and the isolation region 120 when the groove is formed. That is, the walls of the groove are all made of the semiconductor substrate material. Then, the semiconductor substrate material is used as the seed crystal. This is beneficial for the semiconductor material to grow uniformly along respective directions in the groove, and hence beneficial to reduce the possibility of the formation for the gap at the interface of the formed S/D region and the isolation region 120.

Figure 19:
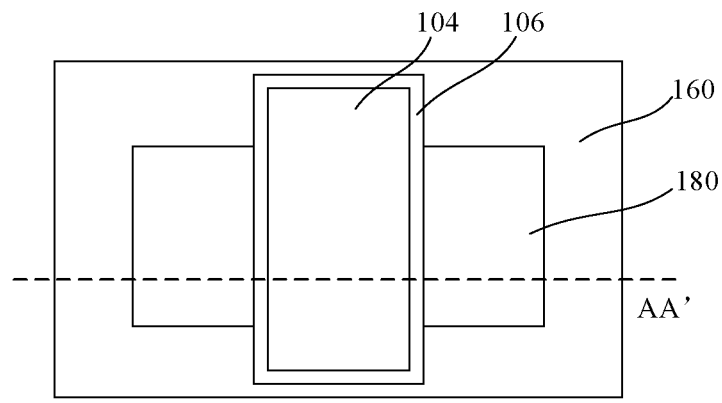
FIGS. 19-20 illustrate structural diagrams after a groove is formed in the method for forming the semiconductor device according to the embodiment of the present invention.
Figure 20:
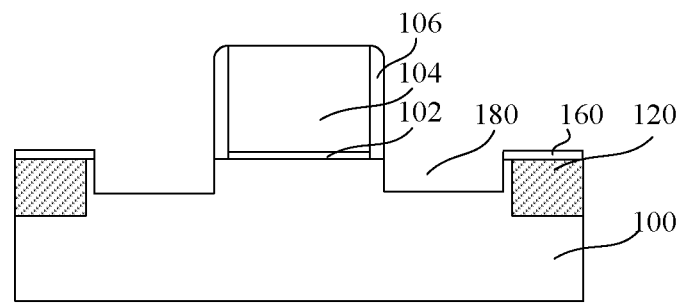

Next, as illustrated in FIGS. 19 and 20, using the auxiliary layer 160, the gate stack structure and the isolation region 120 as a mask, the semiconductor substrate 100 with a partial thickness in the active region 140 is removed so as to form the groove 180.

A conventional process (e.g., etching process) may be adopted to remove the semiconductor substrate 100 of a partial thickness in the active region 140.

By additionally providing the auxiliary layer 160, the semiconductor substrate 100 of the partial thickness may be residual on the sidewalls of the isolation region 120 close to the groove 180 after the groove 180 is formed. The semiconductor substrate 100 of the partial thickness may be used as the seed crystal for subsequently forming the semiconductor material.

The auxiliary layer 160 is additionally provided as a mask during the formation of the residual semiconductor substrate material between the groove 180 and the isolation region 120, and the auxiliary layer 160 may be removed after the residual semiconductor substrate material is formed. This is beneficial for compatibility of the technical solution of the present invention with the conventional process.

Figure 21:
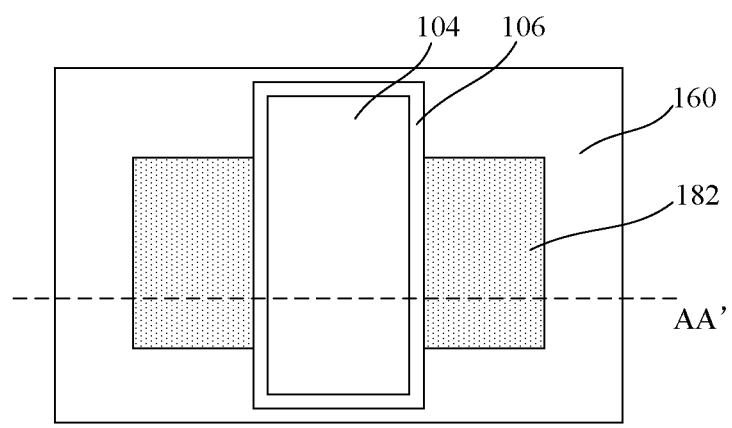
FIGS. 21-22 illustrate structural diagrams after an S/D region is formed in the method for forming the semiconductor device according to the embodiment of the present invention.
Figure 22:
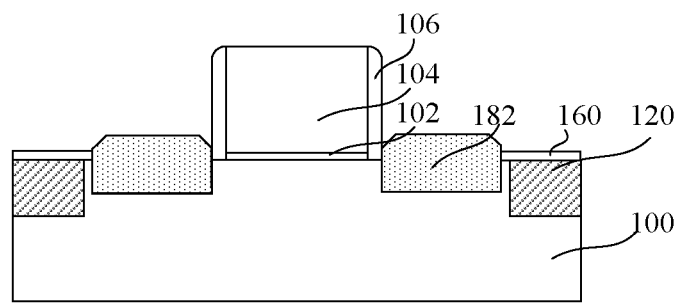

Finally, as illustrated in FIGS. 21 and 22, the semiconductor material 182 is grown in the groove 180 for filling into the groove 180, so as to form the S/D region.

Herein, the walls of the groove 180 are all made of the semiconductor substrate material, and the semiconductor material 182 may be grown in the groove 180 by taking the semiconductor substrate material as the seed crystal so as to form the S/D region by the epitaxial process. Specifically, when the semiconductor substrate 100 comprises Si, for a PMOS device, the S/D region may be $Si_{1-x}Ge_x$ (X may be in the range of 0.1-0.7, and may be adjusted flexibly according to the process requirement, such as 0.2, 0.3, 0.4, 0.5 or 0.6. The value of X in this specification is the same as that indicated herein unless otherwise specified); for an NMOS device, the S/D region may be Si:C (the atomic percentage of C may be 0.2%-2%, such as 0.5%, 1% or 1.5%, the content of C may be adjusted flexibly according to the process requirement, and the atomic percentage of C in this specification is the same as that indicated herein unless otherwise specified). To be noted, the semiconductor material 182 may be a semiconductor material doped with ions, e.g., $Si_{1-x}Ge_x$ or Si:C of N type or P type. The ion doping operation may be directly performed during the growing of the semiconductor material 182 (e.g., doping a reactant containing the doped ion components into the reactants for growing the semiconductor material 182), or performed through an ion implantation process after the semiconductor material 182 is grown. Any conventional ion implantation process may be adopted to perform the ion doping operation, which herein is not described in detail.

Forming the S/D region with the above material is beneficial to adjust the stress in the channel region of the semiconductor device by using the stress provided by the S/D region, so as to improve the mobility of carriers in the channel region. Forming the S/D region with the method provided by the present invention is beneficial to reduce the stress loss of the S/D region.

The present invention further provides a semiconductor device formed on an active region, the active region is formed on a semiconductor substrate and surrounded by an isolation region, and the semiconductor device comprises: a gate stack structure being formed on the active region and extending onto the isolation region; an S/D region embedded into the semiconductor substrate in the active region and located at both sides of the gate stack structure; wherein, the semiconductor substrate material is formed at an interface region of the S/D region and the isolation region.

In a direction parallel to the source to drain direction, the width of the semiconductor substrate material at the interface region of the S/D region and the isolation region is far less than the width of the active region. For example, the width of the semiconductor substrate material interposed between the S/D region and the isolation region may be less than or equal to 5% of the width of the active region. Specifically, when the width of the active region is 2000 Å, the width of the semiconductor substrate material interposed between the S/D region and the isolation region may be 100 Å. In practice, the width of the semiconductor substrate material interposed between the S/D region and the isolation region may be the minimum dimension allowed by a photolithographic process for the purpose of making the supplemented seed crystal as thin as possible, so that the technical solution of the present invention is well compatible with the conventional process. Other related structures are all the same as the previous embodiments, and herein are not described repeatedly.

Furthermore, the scope of the present invention is not limited to the processes, structures, manufacturing, compositions, means, methods and steps of the specific embodiments as described in the specification. According to the disclosure of present invention, a person skilled in the art will easily appreciate that, when the processes, structures, manufacturing, compositions, means, methods and steps currently existing or to be developed in future are adopted to perform functions substantially the same as corresponding embodiments described in the present invention, or achieve substantially the same effects, a person skilled in the art may make applications of them under the teaching of the present invention, without deviating from the scope of the present invention.

What is claimed is:

1. A method for forming a semiconductor device, comprising:

forming an active region and an isolation region surrounding the active region on a semiconductor substrate;

forming a gate stack structure, wherein the gate stack structure is formed on the active region and extends onto the isolation region; and forming an S/D region, wherein the S/D region is embedded into the semiconductor substrate in the active region and located at both sides of the gate stack structure;

wherein the step of forming the S/D region comprises:

determining an interface region comprising the active region of a partial width abutting the isolation region, and forming an auxiliary layer covering the interface region;

removing the semiconductor substrate of a partial thickness in the active region using the auxiliary layer, the gate stack structure and the isolation region as a mask, so as to form a groove;

growing a semiconductor material in the groove for filling into the groove; and removing the auxiliary layer.

2. The method according to claim 1, wherein the auxiliary layer is made of one of silicon oxide and silicon nitride, or a combination thereof.

3. The method according to claim 1, wherein the partial width is far less than the width of the active region in a direction parallel to the source to drain direction.

4. The method according to claim 3, wherein the partial width is the minimum dimension allowed by a photolithographic process.

5. The method according to claim 1, wherein for a PMOS device, the semiconductor material is $Si_{1-X}Ge_X$; and for an NMOS device, the semiconductor material is Si:C.

* * * * *